(12) United States Patent
Mo et al.

(10) Patent No.: US 10,686,021 B2
(45) Date of Patent: Jun. 16, 2020

(54) MASK PLATE, OLED DISPLAY SUBSTRATE, METHOD FOR MANUFACTURING THE OLED DISPLAY SUBSTRATE, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Zailong Mo, Beijing (CN); Zhiyong Yang, Beijing (CN); Fan Yang, Beijing (CN); Da Zhou, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/996,047

(22) Filed: Jun. 1, 2018

(65) Prior Publication Data

US 2019/0035866 A1 Jan. 31, 2019

(30) Foreign Application Priority Data

Jul. 28, 2017 (CN) .......................... 2017 1 0629547

(51) Int. Cl.
*H01L 27/32* (2006.01)
*H01L 51/52* (2006.01)
*H01L 51/56* (2006.01)
*G09G 3/3258* (2016.01)
*H01L 51/00* (2006.01)

(52) U.S. Cl.
CPC ....... *H01L 27/3246* (2013.01); *G09G 3/3258* (2013.01); *H01L 51/5206* (2013.01); *H01L 51/5221* (2013.01); *H01L 51/5225* (2013.01); *H01L 51/56* (2013.01); *H01L 51/0011* (2013.01); *H01L 51/0096* (2013.01); *H01L 2251/558* (2013.01)

(58) Field of Classification Search
CPC . H01L 27/3246; H01L 51/5206; H01L 51/56; H01L 51/5225; H01L 51/5221; H01L 51/0096; H01L 51/0011; H01L 2251/558; G09G 3/3258; G03F 1/64
See application file for complete search history.

(56) References Cited

U.S. PATENT DOCUMENTS

2004/0239238 A1\* 12/2004 Lee ..................... H01L 27/3246
                                                  313/504
2018/0294322 A1\* 10/2018 Han ..................... H01L 33/145

\* cited by examiner

*Primary Examiner* — Muhammad N Edun
(74) *Attorney, Agent, or Firm* — Brooks Kushman P.C.

(57) ABSTRACT

The present disclosure provides a mask plate, an OLED display substrate and a method for manufacturing the OLED display substrate, and a display device. The mask plate comprises a plurality of openings arranged as an array and configured to prepare patterns of a pixel definition layer, wherein a width of the opening close to a first side of the mask plate in a first direction is greater than that of the opening away from the first side of the mask plate, and the first direction is a direction from the opening close to the first side of the mask plate to the opening away from the first side of the mask plate. A slope angle of the pattern of the pixel definition layer close to a second side of the OLED display substrate is smaller than that away from the second side of the OLED display substrate.

14 Claims, 3 Drawing Sheets

MASK PLATE, OLED DISPLAY SUBSTRATE, METHOD FOR MANUFACTURING THE OLED DISPLAY SUBSTRATE, AND DISPLAY DEVICE

CROSS-REFERENCE TO RELATED APPLICATION

This application claims priority to Chinese Patent Application No. 201710629547.1 filed on Jul. 28, 2017, which is incorporated herein by reference in its entirety.

TECHNICAL FIELD

The present disclosure relates to the field of display technology, in particular to a mask plate, an organic light-emitting diode (OLED) display substrate, a method for manufacturing the OLED display substrate, and a display device.

BACKGROUND

In the OLED display device in the related art, a Vss signal is input to the cathode by an IC (i.e. a driving circuit), and a Vdd signal is input to the anode by the IC. A voltage difference between the Vdd signal and the Vss signal is a driving voltage $\Delta V$ which drives the light-emitting material to emit light.

Since the data line in the OLED display device has a certain impedance, the Vdd signal at a distal end of the IC has a certain voltage drop compared to the Vdd signal at a proximal end of the IC, resulting in a difference in the driving voltage $\Delta V$ between the distal end and the proximal end of the IC and thus occurrence of a problem in long run uniformity (LRU), i.e., the long-run display brightness of the OLED display device is ununiform. Moreover, as the screen size increases, the average brightness of the display increases and the LRU becomes worse, making it difficult to achieve high-quality display, and especially for monochrome grayscale images, it can be evidently seen that the display brightness at the proximal end of the IC is higher than that at the distal end of the IC.

SUMMARY

An object of the present disclosure is to provide a mask plate, an OLED display substrate, a method for manufacturing the OLED display substrate and a display device.

To achieve this object, embodiments of the present disclosure provide the following technical solutions.

In one aspect, an embodiment of the present disclosure provides a mask plate, comprising a plurality of openings arranged in the form of an array and configured to prepare patterns of a pixel definition layer of an OLED display substrate, wherein a width of the opening close to a first side of the mask plate in a first direction is greater than a width of the opening away from the first side of the mask plate in the first direction, and the first direction is a direction from the opening close to the first side of the mask plate to the opening away from the first side of the mask plate.

In one example, regions configured with the plurality of openings comprises a $1^{st}$ region, a $2^{nd}$ region, . . . , and an $n^{th}$ region arranged sequentially in the first direction, each of the regions comprises at least one opening, and the openings in each region have an identical width in the first direction, and along the first direction, the width of the opening(s) in a $(k-1)^{th}$ region in the first direction is greater than the width of the opening(s) in a $k^{th}$ region in the first direction, where k is an integer greater than 1 and not greater than n.

In one example, the width of the opening(s) in the $(k-1)^{th}$ region in the first direction is half of a sum of the width of the opening(s) in a $(k-2)^{th}$ region in the first direction and the width of the opening(s) in the $k^{th}$ region in the first direction, where k is an integer greater than 2 and not greater than n.

In another aspect, an embodiment of the present disclosure further provides a method for manufacturing an OLED display substrate, comprising:

forming a photosensitive material layer; and exposing and developing the photosensitive material layer by using the mask plate as described above to form the patterns of the pixel definition layer.

In a further aspect, an embodiment of the present disclosure further provides an OLED display substrate, wherein a slope angle of the pattern of the pixel definition layer close to a second side of the OLED display substrate is smaller than a slope angle of the pattern of the pixel definition layer away from the second side of the OLED display substrate.

In one example, the OLED display substrate comprises a $1^{st}$ region, a $2^{nd}$ region, . . . , and an $n^{th}$ region arranged sequentially in a second direction in which the second direction is a direction from a region close to the second side of the OLED display substrate to a region away from the second side of the OLED display substrate, each of the regions comprises at least one pattern of the pixel definition layer, and the patterns of the pixel definition layer in each region have an identical slope angle, and along the second direction, the slope angle of the pattern(s) of the pixel definition layer in a $(k-1)^{th}$ region is smaller than the slope angle of the pattern(s) of the pixel definition layer in a $k^{th}$ region, where k is an integer greater than 1 and not greater than n.

In one example, the slope angle of the pattern(s) of the pixel definition layer in the $(k-1)^{th}$ region is half of a sum of the slope angle of the pattern(s) of the pixel definition layer in a $(k-2)^{th}$ region and the slope angle of the pattern(s) of the pixel definition layer in the $k^{th}$ region, where k is an integer greater than 2 and not greater than n.

In one example, the slope angle of the pattern(s) of the pixel definition layer in the $1^{st}$ region is in the range of 15° to 20°, and the slope angle of the pattern(s) of the pixel definition layer in the $n^{th}$ region is in the range of 25° to 30°.

In one example, the OLED display substrate further comprises a cathode covering the patterns of the pixel definition layer, and a thickness of a portion of the cathode on a slope of the pattern of the pixel definition layer close to the second side of the OLED display substrate is greater than a thickness of a portion of the cathode on the slope of the pattern of the pixel definition layer away from the second side of the OLED display substrate.

In one example, a resistance of the portion of the cathode close to the second side of the OLED display substrate is smaller than a resistance of the portion of the cathode away from the second side of the OLED display substrate.

In yet another aspect, an embodiment of the present disclosure provides a display device comprising the OLED display substrate as described above as well as a driving circuit which is arranged immediately adjacent to the second side of the OLED display substrate and connected to the cathode.

BRIEF DESCRIPTION OF THE DRAWINGS

FIG. 2 is a schematic view showing that widths of openings of a mask plate for preparing patterns of a pixel definition layer of an OLED display substrate are all a;

Figure 1:
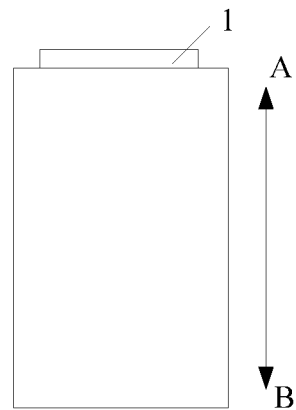
FIG. 1 is a schematic view of an OLED display device.

LIST OF REFERENCE SIGNS 1 driving circuit
2 source and drain metal layer
3 planarization layer
4 anode
5 pixel definition layer
6 cathode
71 opening
7 mask plate

DETAILED DESCRIPTION

In order to make the technical problems to be solved, technical solutions and advantages of the embodiments of the present disclosure more apparent, the following description will be made in detail in conjunction with the drawings and specific embodiments.

As shown in FIG. 1, in the OLED display device in the related art, a Vss signal is input to the cathode by an IC (i.e. a driving circuit) 1, and a Vdd signal is input to the anode by the IC 1. A voltage difference between the Vdd signal and the Vss signal is a driving voltage $\Delta V$ which drives the light-emitting material to emit light.

Since the data line of the OLED display device has a certain impedance, as shown in FIG. 1, in a direction from A to B, the Vdd signal at a distal end of the IC has a certain voltage drop compared to the Vdd signal at a proximal end of the IC, resulting in a difference in the driving voltage $\Delta V$ between the distal end and the proximal end of the IC and thus occurrence of a problem in LRU, i.e., the long-run display brightness of the OLED display device is ununiform. Moreover, as the screen size increases, the average brightness of the display increases and the LRU becomes worse, making it difficult to achieve high-quality display, and especially for monochrome grayscale images, it can be evidently seen that the display brightness at the proximal end of the IC is higher than that at the distal end of the IC.

In order to solve this problem, embodiments of the present disclosure provide a mask plate, an OLED display substrate a method for manufacturing the OLED display substrate, and a display device, which are capable of improving the problem of the ununiform display brightness of the display device, thereby improving the display quality thereof.

In the related art, the cathode of the OLED display substrate is a planar electrode, and the cathode has a very uniform resistance. Therefore, in the direction from A to B, the Vss signal almost exhibits no voltage drop. However, the technical solution of the present disclosure aims to realize a voltage drop of the Vss signal in the direction from A to B. To this end, it is necessary to change the resistance of the cathode in different regions so that the resistance of the cathode in the different regions increases in the direction from A to B, thereby realizing the voltage drop of the Vss signal in the direction from A to B so as to compensate for the voltage drop of the Vdd signal in the direction from A to B. Consequently, the driving voltage $\Delta V$ at the distal end of the IC is kept consistent with the driving voltage $\Delta V$ at the proximal end of the IC, thereby improving the problem of the ununiform display brightness of the display device.

When preparing a cathode on the substrate on which a pattern of a pixel definition layer has been formed, such as depositing the cathode on the substrate on which the pattern of the pixel definition layer has been formed, a thickness of the cathode on a slope of the pattern of the pixel definition layer is related to a slope angle of the pattern of the pixel definition layer. More specifically, the larger the slope angle of the pattern of the pixel definition layer is, the steeper the slope of the pattern of the pixel definition layer is, the smaller the thickness of a portion of the cathode located on the slope of the pattern of the pixel definition layer is when the cathode is deposited, and the greater the resistance of this portion of the cathode is; the smaller the slope angle of the pattern of the pixel definition layer is, the gentler the slope of the pattern of the pixel definition layer is, the thickness of a portion of the cathode located on the slope of the pattern of the pixel definition layer is when the cathode is deposited, and the smaller the resistance of this portion of the cathode is. Meanwhile, the slope angle of the pattern of the pixel definition layer is related to the width of an opening of the mask plate for preparing the pattern of the pixel definition layer. Specifically, the larger the opening of the mask plate for preparing the pattern of the pixel definition layer is, the smaller the slope angle of the pattern of the pixel definition layer is, and the smaller the opening of the mask plate for preparing the pattern of the pixel definition layer is, and the greater the slope angle of the pattern of the pixel definition layer is. Therefore, it is possible to change the slope angle of the pattern of the pixel definition layer by controlling the width of the opening of the mask plate for preparing the pattern of the pixel definition layer, thus changing the resistance of the portion of the cathode located on the slope of the pattern of the pixel definition layer.

Figure 2:
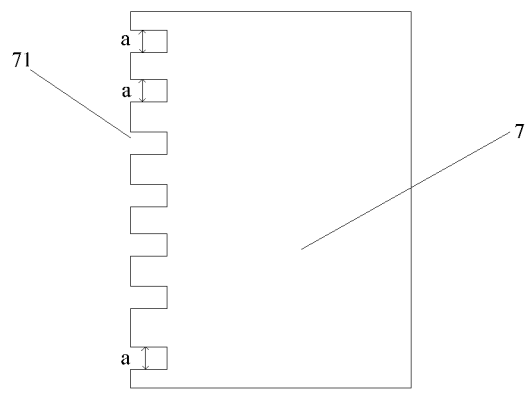
Figure 3:
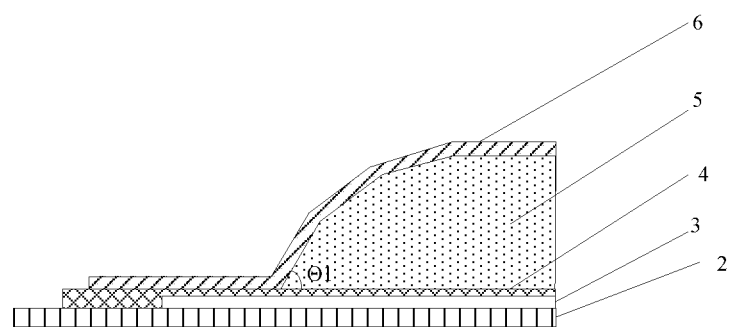
FIG. 3 is a schematic view showing the slope angle of the pattern of the pixel definition layer of the OLED display substrate prepared by using the mask plate of FIG. 2.
Figure 4:
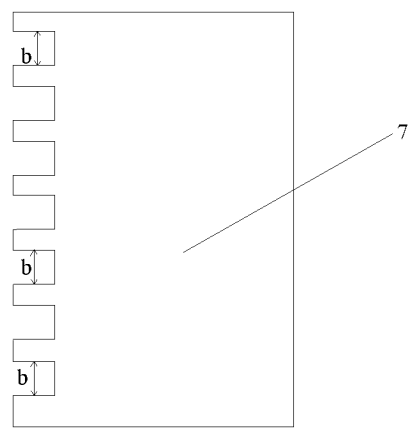
FIG. 4 is a schematic view showing that widths of openings of a mask plate for preparing patterns of a pixel definition layer of an OLED display substrate are all b.
Figure 5:
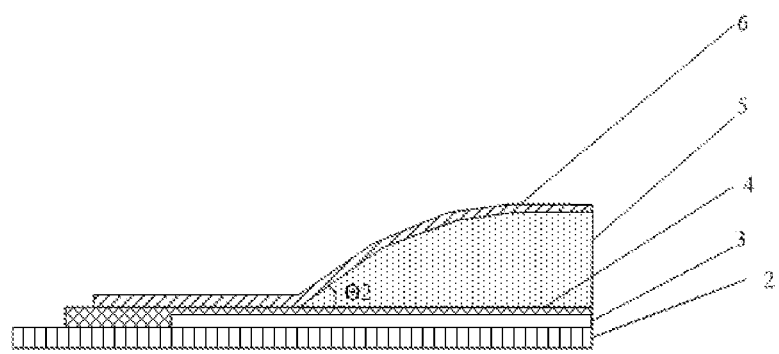
FIG. 5 is a schematic view showing the slope angle of the pattern of the pixel definition layer of the OLED display substrate prepared by using the mask plate of FIG. 4.

In the related art, as shown in FIG. 2, openings 71 of a mask plate 7 for preparing patterns of a pixel definition layer have an identical width in the first direction, which is a. Therefore, slope angles of the patterns of the pixel definition layer of the OLED display substrate manufactured by using the mask plate 7 are identical everywhere, which are θ1, as shown in FIG. 3. When the width of the openings 71 of the mask plate 7 for preparing the patterns of the pixel definition layer are increased to b as shown in FIG. 4, which is greater than a, the slope angles of the patterns of the pixel definition layer of the OLED display substrate manufactured by using the mask plate 7 will be reduced to θ2 as shown in FIG. 5, which is smaller than θ1. FIGS. 2 and 4 illustrate only one row of the openings, and reference may be made to FIGS. 2 and 4 for the width of the openings of other rows of openings.

An embodiment of the present disclosure provides a mask plate that includes a plurality of openings for preparing patterns of a pixel definition layer of the OLED display substrate, wherein a width of the opening close to a first side of the mask plate in a first direction is greater than a width of the opening away from the first side of the mask plate in the first direction, and the first direction is a direction from the opening close to the first side of the mask plate to the opening away from the first side of the mask plate.

In the patterns of the pixel definition layer of the OLED display substrate thus prepared with the mask plate of this embodiment, in a direction from one side of the OLED display substrate, such as a second side of the OLED display substrate corresponding to the first side of the mask plate, to the opposite side of the OLED display substrate, slope angles of the patterns of the pixel definition layer vary, and the slope angle of the pattern of the pixel definition layer close to the second side of the OLED display substrate is smaller than a slope angle of the pattern of the pixel definition layer away from the second side of the OLED display substrate. In this way, it is possible to make the thickness of the cathode covering the slopes of the patterns of the pixel definition layer vary, that is, the thickness of a portion of the cathode on the slope of the pattern of the pixel definition layer close to the driving circuit is greater than the thickness of a portion of the cathode on the slope of the pattern of the pixel definition layer away from the driving circuit. Accordingly, the resistance of the portion of the cathode close to the driving circuit is smaller than the resistance of the portion of the cathode away from the driving circuit, so that signal on the cathode exhibits a voltage drop in a direction from the portion of the cathode close to the driving circuit to the portion of the cathode away from the driving circuit. This voltage drop of the cathode can compensate for the voltage drop of the anode in this direction, so that the driving voltage $\Delta V$ at the distal end of the IC is kept consistent with the driving voltage $\Delta V$ at the proximal end of the IC, thereby improving the problem of the ununiform display brightness of the display device, and improving the display quality thereof.

In one embodiment, regions configured with the plurality of openings comprises a $1^{st}$ region, a $2^{nd}$ region, . . . , and an $n^{th}$ region arranged sequentially in the first direction, each of the regions comprises at least one opening, and the openings in each region have an identical width in the first direction, and along the first direction, the width of the opening(s) in a $(k-1)^{th}$ region in the first direction is greater than the width of the opening(s) in a $k^{th}$ region in the first direction, where k is an integer greater than 1 and not greater than n. In one example, regions configured with the plurality of openings may comprise five regions arranged sequentially in the first direction, or may comprise other number of regions arranged sequentially in the first direction.

Figure 6:
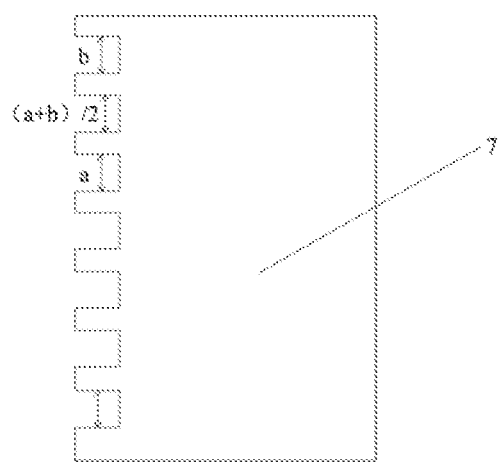
FIG. 6 is a schematic view of a mask plate for preparing patterns of a pixel definition layer of an OLED display substrate of an embodiment of the present disclosure.

In one example, the width of the opening(s) in the $(k-1)^{th}$ region in the first direction is half of a sum of the width of the opening(s) in a $(k-2)^{th}$ region in the first direction and the width of the opening(s) in the $k^{th}$ region in the first direction, where k is an integer greater than 2 and not greater than n. As shown in FIG. 6, the first direction is for example the direction from top to bottom in FIG. 6, the width of the opening(s) in the $(k-1)^{th}$ region in the first direction is $(a+b)/2$, which is half of the sum of the width b of the opening(s) in the $(k-2)^{th}$ region in the first direction and the width a of the opening(s) in the $k^{th}$ region in the first direction, and this can make the variation in the width of the openings more uniform.

An embodiment of the present disclosure provides a method for manufacturing an OLED display substrate, comprising:

forming a photosensitive material layer; and exposing and developing the photosensitive material layer by using the mask plate as described above to form patterns of a pixel definition layer.

In the patterns of the pixel definition layer of the OLED display substrate thus prepared, in a direction from one side of the OLED display substrate, such as a second side of the OLED display substrate corresponding to the first side of the mask plate, to the opposite side of the OLED display substrate, slope angles of the patterns of the pixel definition layer vary, and the slope angle of the pattern of the pixel definition layer close to the second side of the OLED display substrate is smaller than the slope angle of the pattern of the pixel definition layer away from the second side of the OLED display substrate. In this way, it is possible to make the thickness of the cathode covering the slopes of the patterns of the pixel definition layer vary, that is, the thickness of a portion of the cathode on the slope of the pattern of the pixel definition layer close to the driving circuit is greater than the thickness of a portion of the cathode on the slope of the pattern of the pixel definition layer away from the driving circuit. Accordingly, the resistance of the portion of the cathode close to the driving circuit is smaller than the resistance of the portion of the cathode away from the driving circuit, so that signal on the cathode exhibits a voltage drop in a direction from the portion of the cathode close to the driving circuit to the portion of the cathode away from the driving circuit. This voltage drop of the cathode can compensate for the voltage drop of the anode in this direction, so that the driving voltage $\Delta V$ at the distal end of the IC is kept consistent with the driving voltage $\Delta V$ at the proximal end of the IC, thereby improving the problem of the ununiform display brightness of the display device, and improving the display quality thereof.

An embodiment of the present disclosure further provides an OLED display substrate, in which the slope angle of the pattern of the pixel definition layer close to the second side of the OLED display substrate is smaller than the slope angle of the pattern of the pixel definition layer away from the second side of the OLED display substrate. In this way, it is possible to make the thickness of the cathode covering the slopes of the patterns of the pixel definition layer vary, that is, the thickness of a portion of the cathode on the slope of the pattern of the pixel definition layer close to the driving circuit is greater than the thickness of a portion of the cathode on the slope of the pattern of the pixel definition layer away from the driving circuit. Accordingly, the resistance of the portion of the cathode close to the driving circuit is smaller than the resistance of the portion of the cathode away from the driving circuit, so that signal on the cathode exhibits a voltage drop in a direction from the portion of the cathode close to the driving circuit to the portion of the cathode away from the driving circuit. This voltage drop of the cathode can compensate for the voltage drop of the anode in this direction, so that the driving voltage $\Delta V$ at the distal end of the IC is consistent with the driving voltage $\Delta V$ at the proximal end of the IC, thereby improving the problem of the ununiform display brightness of the display device, and improving the display quality thereof.

In an embodiment, the OLED display substrate comprises a $1^{st}$ region, a $2^{nd}$ region, . . . , and an $n^{th}$ region arranged sequentially in a second direction in which the second direction is a direction from a region close to the second side of the OLED display substrate to a region away from the second side of the OLED display substrate, each of the regions comprises at least one pattern of the pixel definition layer, and the patterns of the pixel definition layer in each region have an identical slope angle, and along the second direction, the slope angle of the pattern(s) of the pixel definition layer in a $(k-1)^{th}$ region is smaller than the slope angle of the pattern(s) of the pixel definition layer in a $k^{th}$ region, where k is an integer greater than 1 and not greater than n. In an example, the OLED display substrate may comprise five regions arranged sequentially in the second direction, or may comprise other number of regions arranged sequentially in the second direction.

In one example, the slope angle of the pattern(s) of the pixel definition layer in the $(k-1)^{th}$ region is half of a sum of the slope angle of the pattern(s) of the pixel definition layer in a $(k-2)^{th}$ region and the slope angle of the pattern(s) of the pixel definition layer in the $k^{th}$ region, where k is an integer greater than 2 and not greater than n. In this way, it is possible to make the variation in the slope angle of the pattern of the pixel definition layer more uniform.

In one example, the slope angle of the pattern(s) of the pixel definition layer in the $1^{st}$ region closest to the second side is in the range of 15° to 20°, and the slope angle of the pattern(s) of the pixel definition layer in the $n^{th}$ region farthest from the second side is in the range of 25° to 30°.

In one example, the OLED display substrate further includes a cathode covering the patterns of the pixel definition layer, and a thickness of a portion of the cathode on a slope of the pattern of the pixel definition layer close to the second side of the OLED display substrate is greater than a thickness of a portion of the cathode on a slope of the pattern of the pixel definition layer away from the second side of the OLED display substrate.

In one example, a resistance of the portion of the cathode close to the second side of the OLED display substrate is smaller than a resistance of the portion of the cathode away from the second side of the OLED display substrate.

Figure 7:
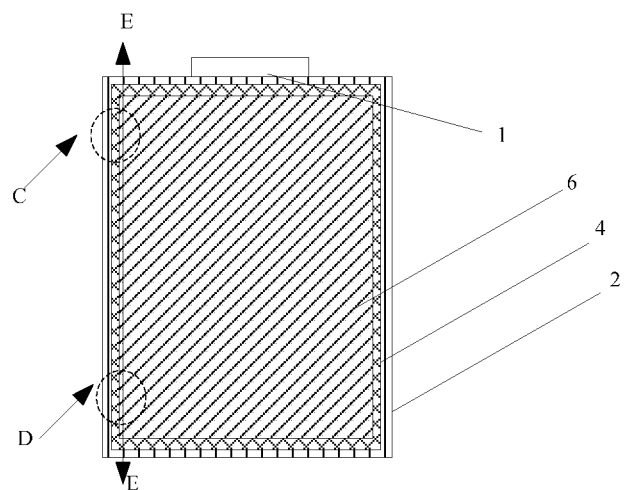
FIG. 7 is a schematic view of a display device of an embodiment of the present disclosure.

An embodiment of the present disclosure further provides a display device comprising the OLED display substrate as described above, and the display device further comprises a driving circuit 1 which is arranged immediately adjacent to the second side of the OLED display substrate and connected to the cathode, as shown in FIG. 7. The display device may be a television, a display, a digital photo frame, a mobile phone, a tablet computer or any other product or component having a display function. The display device may also include a flexible circuit board, a printed circuit board and a backplane.

As shown in FIGS. 3, 5 and 7, the OLED display substrate of the display device includes a source and drain metal layer 2, a planarization layer 3, an anode 4, a pixel definition layer 5 and a cathode 6 arranged in stack. A pattern of the pixel definition layer 5 has a slope, and a slope angle of the pattern of the pixel definition layer can affect a thickness of a portion of the cathode 6 on the slope, that is, the larger the slope angle of the pattern of the pixel definition layer 5 is, the smaller the thickness of the portion of the cathode 6 on the slope is; and the smaller the slope angle of the pattern of the pixel definition layer 5 is, the larger the thickness of a portion of the cathode 6 on the slope is. In this embodiment, as shown in FIG. 7, the slope angle of the pattern of the pixel definition layer 5 in region C close to the driving circuit 1 is smaller than the slope angle of the pattern of the pixel definition layer 5 in region D away from the driving circuit 1.

Figure 8:
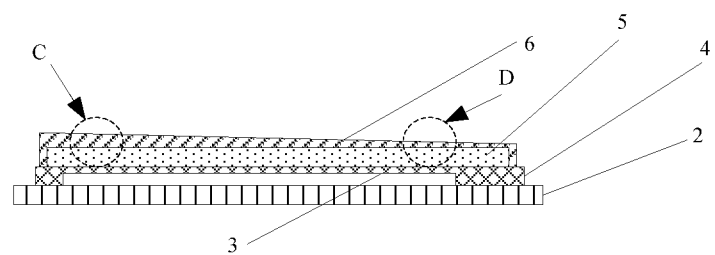
FIG. 8 is a cross-sectional view along EE in FIG. 7.

As shown in FIG. 5, the slope angle of the pattern of the pixel definition layer 5 in region C close to the driving circuit 1 is θ2, and as shown in FIG. 3, the slope angle of the pattern of the pixel definition layer 5 in region D away from the driving circuit 1, where θ2 is smaller than θ1. As can be seen from FIG. 8, which shows a cross-sectional view along EE in FIG. 7, a portion of the cathode 6 on the slope of the pattern of the pixel definition layer in region C has a greater thickness than a portion of the cathode 6 on the slope of the pattern of the pixel definition layer in region D. The resistance of the portion of the cathode 6 in region C close to the driving circuit 1 is smaller than the resistance of the portion of the cathode 6 in region D away from the driving circuit 1. In this way, when the display device works, a Vss signal transmitted through the cathode 6 will exhibit a voltage drop in the direction from region C to region D, and meanwhile the Vdd signal transmitted through the anode 4 will exhibit a voltage drop in the direction from region C to region D due to the impedance existing on the source and drain metal layer 2. Since the driving voltages ΔV in both regions C and D are the difference between the Vdd signal and the Vss signal, the driving voltages ΔV in both regions C and D are kept consistent, thereby improving the problem of the ununiform display brightness of the display device and improving the display quality thereof.

In the above embodiment, the voltage drop of the Vss signal transmitted on the cathode 6 is illustrated only in regions C and D, and for the other regions of the display substrate, the Vss signals transmitted on different regions of the cathode 6 will also exhibit a voltage drop in the direction from the portion of the cathode 6 close to the driving circuit to the portion of the cathode 6 away from the driving circuit, and this will not be repeated herein.

Unless otherwise defined, the technical or scientific terms used herein should have the general meanings understood by a person having ordinary skills in the art to which the present disclosure pertains. The words "first", "second", etc., which are used herein, are not intended to indicate any sequence, amount or importance, but merely used to distinguish different components. The terms "comprise", "include", etc. are intended to specify that the element or object stated before these terms encompasses the elements or objects listed after these terms and equivalents thereof, but do not preclude other elements or objects. The phrases "connect", "couple", etc. are not intended to define a physical connection or a mechanical connection, but may include electrical connection, directly or indirectly. "On", "below", "left", "right" and the like are merely used to indicate a relative positional relationship, and when the absolute position of the described object is changed, the relative position relationship may be changed accordingly.

It may be understood that when an element such as a layer, a film, a region or a substrate is described as locating "on" or "below" another element, said element may be located "directly" "on" or "below" the other element, or there may be an intermediate element therebetween.

The above are the preferred embodiments of the present disclosure. It shall be indicated that several improvements and modifications may be made by a person skilled in the art having ordinary skills in the art without departing from the principle of the present disclosure, and such improvements and modifications shall be also deemed as falling within the protection scope of the present disclosure.

What is claimed is:

1. An organic light-emitting diode (OLED) display substrate, wherein a slope angle of a pattern of a pixel definition layer close to a second side of the OLED display substrate is smaller than a slope angle of a pattern of a pixel definition layer away from the second side of the OLED display substrate, wherein the OLED display substrate comprises a $1^{st}$ region, a $2^{nd}$ region, . . . , and an $n^{th}$ region arranged sequentially in a second direction in which the second direction is a direction from a region close to the second side of the OLED display substrate to a region away from the second side of the OLED display substrate, each of the regions comprises at least one pattern of the pixel definition layer, and the patterns of the pixel definition layer in each region have an identical slope angle, and the slope angle of the pattern(s) of the pixel definition layer in a $(k-1)^{th}$ region is smaller than the slope angle of the pattern(s) of the pixel definition layer in a $k^{th}$ region, where k is an integer greater than 1 and not greater than n.

2. The OLED display substrate according to claim 1, wherein the slope angle of the pattern(s) of the pixel definition layer in the $(k-1)^{th}$ region is half of a sum of the slope angle of the pattern(s) of the pixel definition layer in a $(k-2)^{th}$ region and the slope angle of the pattern(s) of the pixel definition layer in the $k^{th}$ region, where k is an integer greater than 2 and not greater than n.

3. The OLED display substrate according to claim 1, wherein the slope angle of the pattern(s) of the pixel definition layer in the $1^{st}$ region is in the range of 15° to 20°, and the slope angle of the pattern(s) of the pixel definition layer in the $n^{th}$ region is in the range of 25° to 30°.

4. The OLED display substrate according to claim 1, further comprising a cathode covering the patterns of the pixel definition layer, wherein a thickness of a portion of the cathode on a slope of the pattern of the pixel definition layer close to the second side of the OLED display substrate is greater than a thickness of a portion of the cathode on the slope of the pattern of the pixel definition layer away from the second side of the OLED display substrate.

5. The OLED display substrate according to claim 4, wherein a resistance of the portion of the cathode close to the second side of the OLED display substrate is smaller than a resistance of the portion of the cathode away from the second side of the OLED display substrate.

6. The OLED display substrate according to claim 4, wherein the slope angle of the pattern(s) of the pixel definition layer in the $(k-1)^{th}$ region is half of a sum of the slope angle of the pattern(s) of the pixel definition layer in a $(k-2)^{th}$ region and the slope angle of the pattern(s) of the pixel definition layer in the $k^{th}$ region, where k is an integer greater than 2 and not greater than n.

7. The OLED display substrate according to claim 4, wherein the slope angle of the pattern(s) of the pixel definition layer in the $1^{st}$ region is in the range of 15° to 20°, and the slope angle of the pattern(s) of the pixel definition layer in the $n^{th}$ region is in the range of 25° to 30°.

8. A display device, comprising the OLED display substrate according to claim 1, as well as a driving circuit arranged immediately adjacent to the second side of the OLED display substrate and connected to a cathode.

9. The display device according to claim 8, wherein the slope angle of the pattern(s) of the pixel definition layer in a $(k-1)^{th}$ region is half of a sum of the slope angle of the pattern(s) of the pixel definition layer in the $(k-2)^{th}$ region and the slope angle of the pattern(s) of the pixel definition layer in the $k^{th}$ region, where k is an integer greater than 2 and not greater than n.

10. The display device according to claim 8, wherein the slope angle of the pattern(s) of the pixel definition layer in the $1^{st}$ region is in the range of 15° to 20°, and the slope angle of the pattern(s) of the pixel definition layer in the $n^{th}$ region is in the range of 25° to 30°.

11. The display device according to claim 8, wherein the OLED display substrate further comprises a cathode covering the patterns of the pixel definition layer, and a thickness of a portion of the cathode on a slope of the pattern of the pixel definition layer close to the second side of the OLED display substrate is greater than a thickness of a portion of the cathode on the slope of the pattern of the pixel definition layer away from the second side of the OLED display substrate.

12. The display device according to claim 8, wherein a resistance of the portion of the cathode close to the second side of the OLED display substrate is smaller than a resistance of the portion of the cathode away from the second side of the OLED display substrate.

13. An organic light-emitting diode (OLED) display substrate, wherein a slope angle of a pattern of a pixel definition layer close to a second side of the OLED display substrate is smaller than a slope angle of a pattern of a pixel definition layer away from the second side of the OLED display substrate,
    wherein the OLED display substrate comprises a cathode covering the patterns of the pixel definition layer, wherein a thickness of a portion of the cathode on a slope of the pattern of the pixel definition layer close to the second side of the OLED display substrate is greater than a thickness of a portion of the cathode on the slope of the pattern of the pixel definition layer away from the second side of the OLED display substrate, and
    wherein a resistance of the portion of the cathode close to the second side of the OLED display substrate is smaller than a resistance of the portion of the cathode away from the second side of the OLED display substrate.

14. A display device, comprising the OLED display substrate according to claim 13, as well as a driving circuit arranged immediately adjacent to the second side of the OLED display substrate and connected to a cathode.

* * * * *